United States Patent
Bouchet et al.

(10) Patent No.: US 8,094,423 B2
(45) Date of Patent: Jan. 10, 2012

(54) PROTECTION CIRCUIT FOR MOSFET

(75) Inventors: Andre Bouchet, Cholet (FR); Bertrand Gerfault, St MaCaire en Mauges (FR)

(73) Assignee: Thales (FR)

( * ) Notice: Subject to any disclaimer, the term of this patent is extended or adjusted under 35 U.S.C. 154(b) by 0 days.

(21) Appl. No.: 12/681,552

(22) PCT Filed: Oct. 1, 2008

(86) PCT No.: PCT/EP2008/063189
§ 371 (c)(1),
(2), (4) Date: Jul. 7, 2010

(87) PCT Pub. No.: WO2009/043892
PCT Pub. Date: Apr. 9, 2009

(65) Prior Publication Data
US 2010/0271737 A1    Oct. 28, 2010

(30) Foreign Application Priority Data
Oct. 2, 2007   (FR) .................................... 07 06898

(51) Int. Cl.
*H02H 3/20*   (2006.01)
*H02H 9/04*   (2006.01)
*H02H 9/00*   (2006.01)
*H02H 7/00*   (2006.01)

(52) U.S. Cl. ........................................ 361/91.1; 361/18

(58) Field of Classification Search ................. 361/91.1
See application file for complete search history.

(56) References Cited

U.S. PATENT DOCUMENTS

| | | | |
|---|---|---|---|
| 3,792,292 A | 2/1974 | Priel | |
| 4,678,950 A | 7/1987 | Mitake | |
| 5,229,660 A | 7/1993 | Shiotsu | |
| 6,856,200 B1 | 2/2005 | Wei et al. | |
| 7,242,560 B2 * | 7/2007 | Nair et al. | 361/56 |
| 7,324,316 B2 * | 1/2008 | Chen et al. | 361/93.9 |
| 7,453,308 B2 * | 11/2008 | Tihanyi | 327/309 |
| 7,592,673 B2 * | 9/2009 | Burdeaux et al. | 257/355 |
| 7,859,805 B2 * | 12/2010 | Tsuchihashi | 361/56 |
| 2001/0009494 A1 * | 7/2001 | Umekawa | 361/93.9 |

* cited by examiner

Primary Examiner — Dharti Patel
(74) Attorney, Agent, or Firm — Baker & Hostetler, LLP

(57) ABSTRACT

The present invention relates to a protection circuit for MOS-technology field-effect transistors. The circuit comprises at least one MOSFET protected by a module for blocking said MOSFET, the module being placed between the gate of the MOSFET and an electrical conductor, the module comprising switched connection means having at least two states: a first state which connects the gate of the MOSFET to the conductor, which is maintained at an electrical potential suitable for blocking the MOSFET, this first state being activated in the presence of an alarm signal; and a second state which disconnects the gate of the MOSFET, this second state being activated in the absence of the alarm signal. The invention applies notably to the protection of the power MOSFETs included in the amplification stages of electronic systems.

6 Claims, 3 Drawing Sheets

_US 8,094,423 B2_

PROTECTION CIRCUIT FOR MOSFET

CROSS-REFERENCE TO RELATED APPLICATIONS

This application is a National Stage of International patent application PCT/EP2008/063189, filed on Oct. 1, 2008, which claims priority to foreign French patent application No. FR 07 06898, filed on Oct. 2, 2007, the disclosures of which are hereby incorporated by reference in their entirety.

FIELD OF THE INVENTION

The present invention relates to a protection circuit for MOS-technology field-effect transistors, these transistors being commonly called MOSFET which is an acronym deriving from the expression "metal-oxide-semiconductor field effect transistor". The invention applies notably to the protection of the power MOSFETs included in the amplification stages of electronic systems.

BACKGROUND OF THE INVENTION

The power MOSFETs used in the amplification stages of these systems are sometimes subject to electric shocks that can cause them to be damaged, or even destroyed. As an example, a power amplifier in a radiocommunication system is sometimes subject to abrupt changes of load impedance, for example when an antenna at the output of the amplifier is connected/disconnected or when there is a switch of spectral band in operation. When the system is in use, the accumulation of these electric shocks can degrade the reliability of the amplifier.

Moreover, during the optimization phase of the electronic systems, the amplitude of the electric current used may vary strongly because of the tests carried out on the system, thus rendering the components, notably the MOSFETs, vulnerable to destruction. Such destruction during the optimization phases generates significant additional costs, with certain power MOSFETs being particularly costly.

Many existing systems rely on the use of MOSFETs whose intrinsic characteristics make it possible to withstand fairly unfavorable operating conditions, without, however, being able to protect the MOSFET against certain incidents such as excessively high excitation currents. Some circuits have been proposed in order to protect the MOSFETs. Notably, it is known to associate with the MOSFET a circuit that behaves like a fuse, cutting the excitation current of the MOSFET in the event of a malfunction. However, the known circuits do not operate at radiofrequencies and/or require a large number of components.

The American patent published under the reference U.S. Pat. No. 6,856,200 for the company Marvell International Ltd. provides a protection circuit comprising a switching transistor acting as a switch between the gate of the MOSFET to be protected and the electrical ground, the switching transistor being placed in the closed position when a control signal is emitted to the drain of said switching transistor. However, when this switching transistor is placed in the open position, it acts as an undesirable capacitance between the gate of the MOSFET and the electrical ground, this capacitance disrupting the operation of the circuit comprising the MOSFET, notably at high frequencies.

The protection circuit should preferably neither affect the performance of the circuit comprising the MOSFET, nor restrict its operating ranges, in particular temperature-wise.

SUMMARY OF THE INVENTION

One aim of the invention is to protect a MOSFET from damage or destruction by associating with it a protection module comprising few components and having no or almost no effect on the operation of the circuit comprising said MOSFET. To this end, the subject of the invention is a circuit comprising at least one MOSFET protected by a module for blocking said MOSFET, the module being placed between the gate of the MOSFET and an electrical conductor, the module comprising switched connection means having at least two states:
  a first state which connects the gate of the MOSFET to the conductor, which is maintained at an electrical potential suitable for blocking the MOSFET, this first state being activated in the presence of an alarm signal,
  a second state which disconnects the gate of the MOSFET, this second state being activated in the absence of the alarm signal,
the circuit being characterized in that the switching means comprise at least one diode and a field-effect switching transistor, the anode of the diode being connected to the gate of the MOSFET, the cathode of the diode being connected to the drain of the switching transistor, the source of the switching transistor being connected to the electrical conductor, and the gate of the switching transistor being controlled by the alarm signal.

The protection circuit thus constitutes a power switch with weak spurious elements, a simple switching transistor not making it possible to both protect the MOSFET and allow it to operate normally unprotected.

Unlike the protection circuits of the prior art, the switching means are based on the diode and not on the switching transistor. The switching transistor is used to set the diode to conducting mode and to set it to blocked mode. According to one embodiment, the switching transistor is a field-effect transistor.

The diode can be a PIN diode.

The circuit according to the invention may comprise a reverse-bias resistor, said resistor being powered on its first terminal by a voltage source and connected by its second terminal to the drain of the switching transistor.

According to another embodiment, the diode is a Schottky diode.

According to an embodiment in which the MOSFET is enriched, the electrical conductor is connected to the electrical ground.

The alarm signal may be generated by a control module comprising at least one comparator which compares a reference signal with a second signal representing a physical quantity to be monitored in order to generate an alert signal when the second signal exceeds a threshold defined by the reference signal, the alarm signal being produced by combining the alert signals obtained from the comparators.

According to one embodiment, the MOSFET is a power MOSFET. Moreover, the MOSFET may operate at radiofrequencies.

BRIEF DESCRIPTION OF THE DRAWINGS

Further features will become apparent from reading the following detailed description, given by way of nonlimiting example in light of the appended drawings which represent.

DETAILED DESCRIPTION

Figure 1:
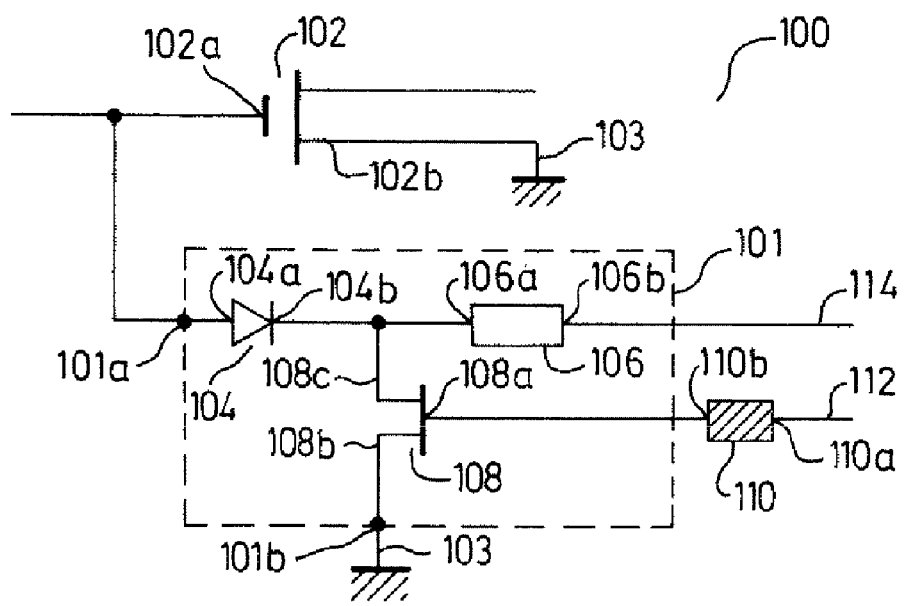
FIG. 1, a first embodiment of a circuit comprising a protection module according to the invention,
  FIG. 2, an equivalent diagram showing the principle of the protection module according to the invention, FIG. 3, a second embodiment of a circuit comprising a protection module according to the invention, FIG. 4, one embodiment of a control module producing an alarm signal for the protection module according to the invention, FIG. 5, one implementation of the protection module according to the invention on symmetrically-mounted MOSFETs.

FIG. 1 shows one embodiment of a circuit comprising a protection module according to the invention. A MOSFET 102 included in an electronic device 100, for example a power amplification circuit, is associated with a protection module 101.

A first terminal 101a for accessing the protection module 101 is connected to the gate 102a of the MOSFET 102 to be protected. A second terminal 101b for accessing the protection module 101 is connected to the electrical ground 103. A third terminal 101c for accessing the protection module 101 is connected to a control module 110. The source 102b of the MOSFET 102 is connected to the electrical ground 103. In the example of FIG. 1, the protection module 101 comprises a diode 104, a resistor 106, and a transistor 108. The transistor 108 is, in the example, a field-effect transistor, this type of transistor being appropriate for effecting switching operations. The anode 104a of the diode 104 is connected to the first terminal 101a for accessing the protection module 101. The cathode 104b of the diode 104 is connected to a first terminal 106a of the resistor 106 and to the drain 108c of the transistor 108. The source 108b of the transistor 108 is connected to the second terminal 101b for accessing the protection module 101, that is, to the electrical ground 103, whereas the gate 108a of the transistor 108 is connected to the third terminal 101c for accessing the protection module 101, in other words to the control module 110. The second terminal 106b of the resistor 106 is connected to a voltage source 114.

The control module 110 receives at the input 110a indicator signals 112 obtained, for example, from sensors arranged in the electronic device 100. These sensors are used, for example, to monitor the temperature, the standing wave ratio in the circuit or even the current received at the gate of the MOSFET 102. A sensor indicating an abnormal value makes it possible to anticipate hostile operating conditions for the MOSFET 102, an abnormal value triggering an alarm signal and/or a control signal in order to prevent damage to the MOSFET 102. For example, an abrupt change of load at the output of the electronic device 100 suddenly increases the standing wave ratio in the device 100. Also, a threshold, stored for example in the control module 110, is determined as a function of the minimum standing wave ratio beyond which the protection of the MOSFET 102 must be triggered, this threshold being notably chosen according to the characteristics of the MOSFET 102 used. If the standing wave ratio exceeds the chosen threshold, then an alarm signal 111 is delivered to an output 110b of the control module 110. Other thresholds, each corresponding to a physical quantity to be monitored, can be stored in the control module 110.

In the example of FIG. 1, the MOSFET 102 to be protected is enriched, which means that a zero electrical potential at the gate 102a of the MOSFET 102 is sufficient to block it.

Moreover, the gate 108a of the transistor 108 is controlled by a signal obtained from the output 110b of the control module 110. This signal is an electric current received by the gate of the transistor 108a, thus increasing the voltage VGS between the gate 108a and the source 108b of the transistor 108. The increase in the voltage VGS acts as a command that makes it possible, when VGS exceeds the threshold voltage of the transistor 108, to virtually short-circuit the drain 108c of the transistor 108 with its source 108b, which is connected to the electrical ground 103. Thus, when a current is produced at the output 110b of the control module 110, there is virtually a short-circuit between the first access terminal 101a and the second access terminal 101b of the protection module 101, that is to say, in the example, between the gate 102a of the MOSFET 102 and the electrical ground 103. This conduction makes it possible to divert the gate current 102a of the MOSFET 102 to the electrical ground 103, thus stopping the excitation of the MOSFET 102. The MOSFET 102 then remains blocked, and therefore protected.

According to a variant of the protection module according to the invention, the second access terminal 101b of the protection module 101 is connected to a voltage source and not to the electrical ground 103 as illustrated in FIG. 1. This variant can notably be employed to protect depleted MOSFETs for which a biasing of the gate 102a of the MOSFET 102 with a nonzero voltage is necessary in order to be able to block the MOSFET 102. As an example, in the case of a MOSFET 102 with depleted N channel, the second access terminal 101b of the protection module 101 is connected to a negative voltage source, so as to bias the gate 102a of the MOSFET 102 to cancel the conductivity of the conduction channel.

Figure 2:
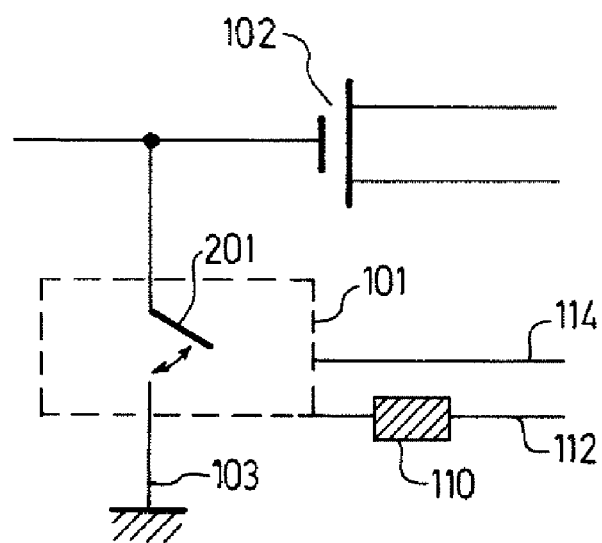

As illustrated by FIG. 2, the protection module 101 can be modeled as a switch 201 between the gate 102a of the MOSFET 102 and an electrical potential which, in the example, is the electrical ground 103. In practice, the transistor 108 acts as a switch controlled by the control module 110. In the absence of any anomaly detected by the control module 110, the switch formed by the transistor 108 and the diode 104 (FIG. 1) remains open, which renders the protection module 101 almost electrically transparent with respect to the MOSFET 102. When an alarm signal 111 is produced by the module 110, the voltage VGS increases suddenly and the transistor 108 conducts the current between its drain 108c and its source 108b, in other words the switch 201 is placed in the closed position.

The diode 104 masks the spurious capacitance of the transistor 108 when the latter is in open mode, that is to say when it does not conduct the current between its drain 108c and its source 108b. Without the diode 104, the spurious capacitance of the transistor 108 would be placed in parallel with the MOSFET 102 and would greatly limit the operation of the circuit at high frequencies. Thanks to the presence of the diode 104, provided with a weak equivalent reverse capacitance, it is possible to cancel the effects of the spurious capacitance of the transistor 108 when it is placed in the open position. As an illustration, for a spurious capacitance C1 of the transistor 108 equal to 100 pF, an equivalent capacitance C2 of the diode 104 equal to 2 pF, the resultant capacitance CS due to the transistor 108 and to the diode 104 is equal to $1/(1/C1+1/C2) \approx 1.96$ pF. In other words, when the spurious capacitance C1 of the transistor 108 is very large compared to the equivalent capacitance C2 of the diode 104, the capacitance CS resulting from the series association of these two capacitances is almost equal to that of the diode 104, and therefore to a very weak capacitance CS. The damaging influence of this resultant capacitance CS is therefore greatly lessened thanks to the presence of the diode 104.

Figure 3:
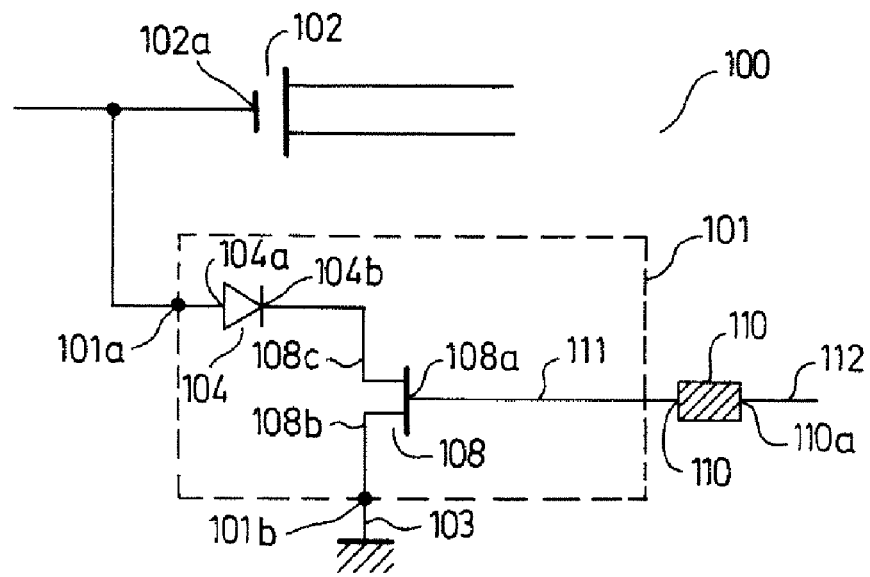

In order to maintain a positive voltage VDS between the drain 108c and the source 108b of the transistor 108 when the excitation current of the gate 102a of the MOSFET 102 is an alternating current, the diode 104 performs a half-wave rectification of the current. At high frequencies, for example of the order of 1 GHz, a PIN diode (or "positive intrinsic negative diode") is, preferentially, employed for its short switching times. In this case, the reverse-bias resistor 106 powered by the voltage source 114 becomes necessary. At frequencies that are not so high, for example of the order of a few hundred kilohertz, a Schottky-type diode can be used, in which case the reverse-bias resistor 106 is not necessary, as illustrated by FIG. 3 which shows a second embodiment of the protection module according to the invention in which no bias resistor is used. Those elements that are identical to the elements already present in the other figures are given the same references.

According to another embodiment, the switch 201 between the gate 102*a* of the MOSFET 102 and the electrical ground 103 can be produced with other means, for example by thyristor or by electromechanical microsystems, often called MEMS, "micro-electro-mechanical systems".

Figure 4:
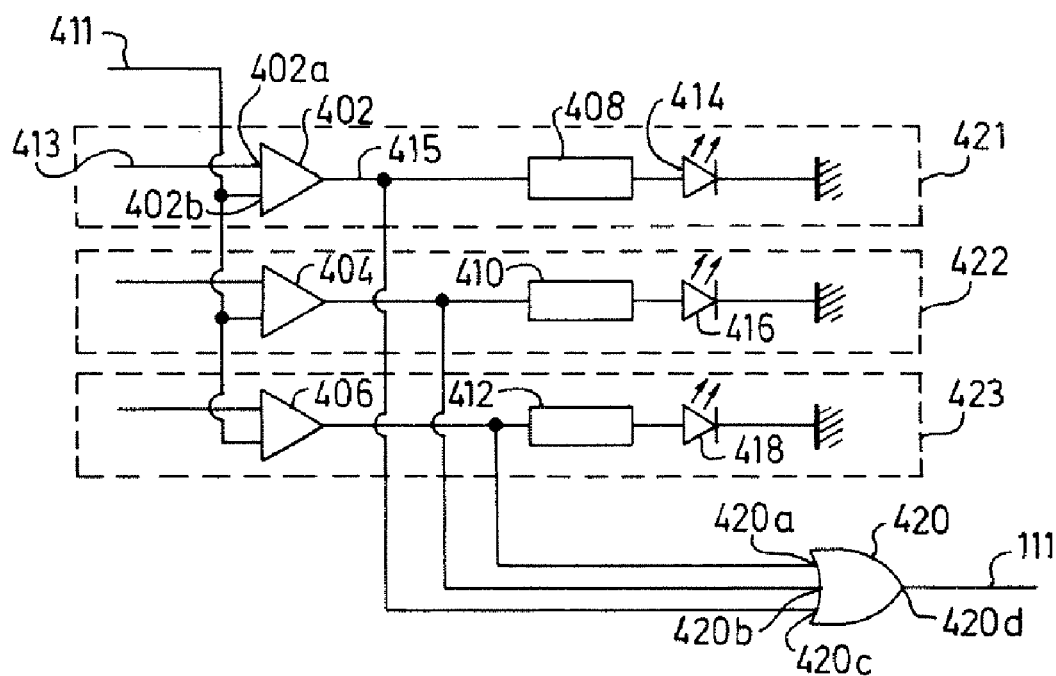

In order to better understand the principle of activation of the protection module 101, FIG. 4 shows one embodiment of a control module used for the protection module according to the invention. The control module 110 of FIG. 4 comprises, for each physical quantity monitored, a threshold voltage comparator 402, 404, 406, a flip-flop 408, 410, 412, and a light-emitting diode 414, 416, 418. In the example of FIG. 4, three physical quantities are monitored: the temperature, the standing wave ratio and the excitation current received by the gate 102*a* of the MOSFET 102. Other physical quantities could be monitored by the device. A first part 421 of the control module 110, used to monitor temperature, is described in more detail hereinbelow. Each of the other parts 422, 423 of the control module 110 is used to monitor another physical quantity and is produced according to the same principle as the first part 421.

The first part 421 comprises a comparator 402 that has two inputs 402*a*, 402*b*. A first electrical signal 413, with characteristics dependent on temperature, is directed to the first input 402*a*, while the second input 402*b* receives a reference electrical signal 411. As an example, the amplitude of the first signal 413 indicates the temperature measured on the electronic device 100 and the reference signal 411 is a 5V DC current. The first signal 413 representing the temperature can be generated by the electronic device 100 using sensors known to those skilled in the art, as can the other signals representing the other physical quantities monitored. The comparator 402 also has an output 402*c* which supplies the result of the comparison between the first signal 413 and the reference electrical signal 411. In the example, the voltage of the reference signal 411 is chosen as a function of the maximum temperature value accepted by the electronic device 100. A first signal 413 of voltage greater than that of the reference signal 411 causes an alert signal 415 to be produced at the output 402*c* of the comparator. When the voltage of the first signal 413 does not exceed the voltage of the reference signal 411, no signal is emitted at the output of the comparator 402 of the example. For the other parts 421, 422, 423 of the control module 110, one and the same voltage value or different reference voltage values can be used. The output 402*c* of the comparator 402 is connected to a flip-flop 408 mounted in series with a light-emitting diode 414. In the absence of an alert signal 415 at the output 402*c* of the comparator 402, the flip-flop 408 remains in the open position. As soon as an alert signal 415 is received by the flip-flop 408, said flip-flop is placed in the closed position, so as to switch on the light-emitting diode 414. This light-emitting diode 414 is used to warn the user of the electronic device 100 that an abnormal temperature has been reached. According to a simplified embodiment, the control module 110 includes neither flip-flop nor light-emitting diode.

Each part 421, 422, 423 is therefore able to supply an alert signal at the output 402*c*, 404*c*, 406*c* of the comparator 402, 404, 406. To produce the alarm signal 111 used to activate the protection module 101 (FIG. 1), these alert signals are combined in a logic function, which in the example is an "inclusive or" module 420. Thus, the output 402*c*, 404*c*, 406*c* of each comparator 402, 404, 406 is connected to an input 420*a*, 420*b*, 420*c* of the "inclusive or" module 420, so that, if at least one of the comparators 402, 404, 406 produces an alert signal, the "inclusive or" module generates an alarm signal 111 on its output 420*d*, connected to the output 110*b* of the control module 110. Consequently, if at least one of the physical quantities monitored changes abnormally, which is the sign of a malfunction of the device 100, then an alarm signal 111 is generated at the output 110*b* of the control module 110.

One and the same control module 110 can be associated with several protection circuits 101 so as to control 25 several MOSFET gate blockings concurrently.

Figure 5:
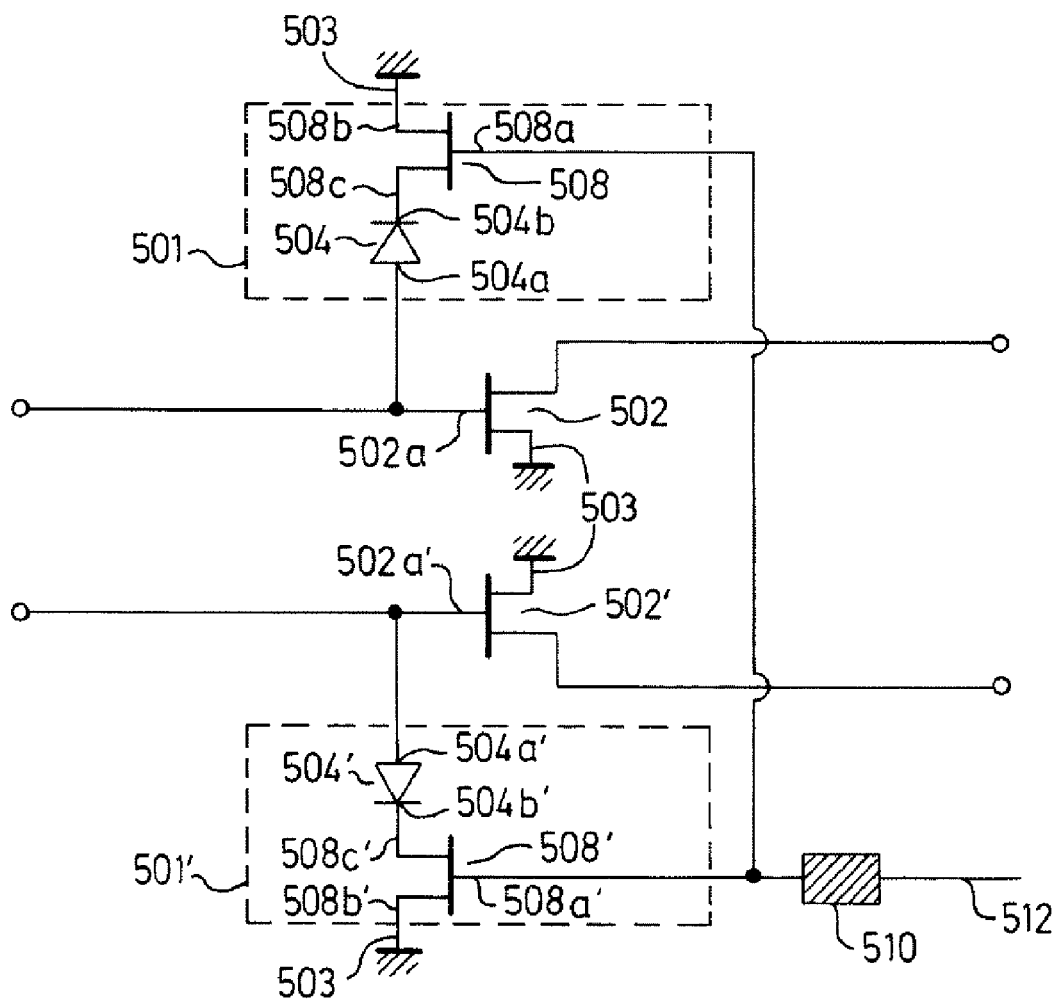

To illustrate this principle, FIG. 5 shows an implementation of the protection module according to the invention on symmetrically mounted MOSFETs. The gate 502*a* of a first MOSFET 502 is connected to a first protection module 501 and the gate 502*a'* of a second MOSFET 502' is connected to a second protection module 501'. In the example, each protection module 501, 501' comprises, as in the embodiment shown in FIG. 3, a transistor 508, 508' and a diode 504, 504', the anode 504*a*, 504*a'* of which is connected to the input 501*a*, 501*a'* of the protection module 501, 501' and the cathode 504*b*, 504*b'* of which is connected to the drain 508*c*, 508*c'* of the transistor. The source 508*b*, 508*b'* of the transistor is connected to the electrical ground 503. A control module 510 receiving indicator signals 512 is connected to the gate 508*a*, 508*a'* of each of the transistors 508, 508'.

One benefit of the protection module according to the invention is that it requires only a few simple components, which makes it an inexpensive circuit with a small footprint.

The invention claimed is:

1. A circuit comprising a MOSFET protected by a module for blocking said MOSFET, the module being placed between the gate of the MOSFET and an electrical conductor, the module comprising switched connection means having at least two states:
    a first state which connects the gate of the MOSFET to the conductor, which is maintained at an electrical potential suitable for blocking the MOSFET, this first state being activated in the presence of an alarm signal,
    a second state which disconnects the gate of the MOSFET, this second state being activated in the absence of the alarm signal,
    wherein the switching means comprises at least one PIN diode and a switching transistor, the switching transistor being a field-effect transistor, the anode of said PIN diode being connected directly to the gate of the MOSFET, the cathode of said PIN diode being connected directly to the drain of the switching transistor, the source of the switching transistor being connected to the electrical conductor, and the gate of the switching transistor being controlled by the alarm signal, the MOSFET operating at radio frequencies.

2. A circuit as claimed in claim 1, wherein a reverse-bias resistor, said resistor being powered on its first terminal by a voltage source and connected by its second terminal to the drain of the switching transistor.

3. A circuit as claimed in claim 1, wherein the diode is a Schottky diode.

4. A circuit according to claim 1, the MOSFET being enriched, the electrical conductor is connected to the electrical ground.

5. A circuit as claimed in claim 1, wherein the alarm signal is generated by a control module comprising at least one comparator which compares a reference signal with a second signal representing a physical quantity to be monitored in order to generate an alert signal when the second signal exceeds a threshold defined by the reference signal, the alarm signal being produced by combining the alert signals obtained from the comparators.

6. A circuit as claimed in claim 1, wherein the MOSFET is a power MOSFET.

* * * * *